US010892330B2

United States Patent
Han et al.

(10) Patent No.: US 10,892,330 B2
(45) Date of Patent: Jan. 12, 2021

(54) FET BASED SYNAPSE NETWORK

(71) Applicant: INTERNATIONAL BUSINESS MACHINES CORPORATION, Armonk, NY (US)

(72) Inventors: Jin P. Han, Fishkill, NY (US); Xiao Sun, White plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1129 days.

(21) Appl. No.: 15/202,729

(22) Filed: Jul. 6, 2016

(65) Prior Publication Data

US 2018/0012123 A1    Jan. 11, 2018

(51) Int. Cl.
| | | |
|---|---|---|
| H01L 29/10 | (2006.01) | |
| H01L 27/092 | (2006.01) | |
| G06N 3/04 | (2006.01) | |
| G06N 3/063 | (2006.01) | |
| H01L 27/24 | (2006.01) | |

(52) U.S. Cl.
CPC ......... *H01L 29/1033* (2013.01); *G06N 3/049* (2013.01); *G06N 3/0635* (2013.01); *H01L 27/092* (2013.01); *H01L 27/24* (2013.01)

(58) Field of Classification Search
CPC ... H01L 29/1033; H01L 27/24; H01L 27/092; G06N 3/0635; G06N 3/049
See application file for complete search history.

(56) References Cited

U.S. PATENT DOCUMENTS

| | | | |
|---|---|---|---|
| 7,049,153 B2 * | 5/2006 | Agarwal ................. | G11C 11/22 257/E21.663 |
| 7,827,131 B2 | 11/2010 | Nugent | |
| 8,311,965 B2 | 11/2012 | Breitwisch et al. | |
| 10,095,718 B2 | 10/2018 | Birdwell et al. | |
| 2003/0098476 A1 * | 5/2003 | Arima .................... | G06N 3/063 257/236 |
| 2014/0172762 A1 * | 6/2014 | Suri ......................... | G06N 3/08 706/25 |
| 2014/0310220 A1 * | 10/2014 | Chang .................... | G06N 3/063 706/25 |
| 2015/0028278 A1 * | 1/2015 | Lee ....................... | H01L 45/085 257/2 |

(Continued)

OTHER PUBLICATIONS

Diorio, C. et al., "A Single-Transistor Silicon Synapse" IEEE Transactions on Electron Devices (Nov. 1996) pp. 1972-1980, vol. 43, No. 11.

(Continued)

*Primary Examiner* — Daniel D Chang
(74) *Attorney, Agent, or Firm* — Tutunjian & Bitetto, P.C.; Erik Johnson

(57) ABSTRACT

A synapse network device includes an array of field effect transistor (FET) devices having controllable channel resistance. Pre-neurons are coupled to the array to provide input pulses to the array on first terminals of the FET devices. Post-neurons are coupled to the array to receive outputs from the array on second terminals of the FET devices and provide feedback to the array on third terminals of the FET devices, wherein a state of the FET devices is indicated based upon signals applied to the FET devices.

20 Claims, 9 Drawing Sheets

(56) References Cited

U.S. PATENT DOCUMENTS

2015/0214322 A1    7/2015  Mueller et al.

OTHER PUBLICATIONS

Nishitani, Y. et al., "Three-terminal ferroelectric synapse device with concurrent learning function for artificial neural networks" Journal of Applied Physics (Jun. 2012) pp. 124108-1-124108-6, vol. 111.

Bartic, A.T. et al., "Preisach model for the simulation of ferroelectric capacitors" Journal of Applied Physics (Mar. 2001) pp. 3420-3425, vol. 89, No. 6.

* cited by examiner

US 10,892,330 B2

FET BASED SYNAPSE NETWORK

BACKGROUND

Technical Field

The present invention generally relates to neural and synapse networks, and more particularly to neural or synapse networks based on field effect transistor devices.

Description of the Related Art

Artificial neural and synaptic systems are potential devices to simulate brain activity efficiently and perform brain-derived computation. For artificial synaptic applications, two-terminal devices, such as phase change memory (PCM) resistors, resistive random access memory (RRAM) or memristor have been exploited. While two-terminal devices permit neural computations, two-terminal devices can lack flexibility and computational control.

SUMMARY

In accordance with an embodiment of the present principles, a synapse network device includes an array of field effect transistor (FET) devices having controllable channel resistance. Pre-neurons are coupled to the array to provide input pulses to the array on first terminals of the FET devices. Post-neurons are coupled to the array to receive outputs from the array on second terminals of the FET devices and provide feedback to the array on third terminals of the FET devices, wherein a state of the FET devices is indicated based upon the input pulses of the FET devices.

A synapse network device includes an array of field effect transistor (FET) devices having controllable channel resistance. Pre-neurons are coupled to the array to provide input pulses to the array on first terminals of the FET devices. Post-neurons are coupled to the array to receive outputs from the array on second terminals of the FET devices and provide feedback to the array on third terminals of the FET devices, wherein a state of the FET devices is indicated based upon the input pulses from pre-neurons and/or post-neurons, as well as the various correlations thereof, including a timing delay between the signals from the pre-neurons and the post neurons. The second terminal may receive the same signals as the first or third terminal(s) during the change of the states. A time delay between the signals can change the states of the FET devices.

Another synapse network device includes a substrate and an array of field effect transistor (FET) devices formed on the substrate and having controllable channel resistance and connected in a crossbar arrangement of metal lines. Pre-neurons are coupled to the array to provide input signals to the array on first terminals of the FET devices, wherein the input pulses are controlled to change channel resistances. Post-neurons coupled to the array to receive outputs from the array on second terminals of the FET devices and provide feedback to the array on third terminals of the FET devices, wherein a state of the FET devices is changed based upon the input signals applied on the first terminals and the third terminals of the FET devices.

A method for programming a synapse network device includes applying input pulses from pre-neurons to an array of field effect transistor (FET) devices on first terminals of the FET devices; receiving outputs from the array on post-neurons coupled to the array from second terminals of the FET devices, wherein a state of the FET devices is read in accordance with the channel resistance of the FET devices; and providing feedback to the array on third terminals of the FET devices, wherein a state of the FET devices is changed based upon signals applied on the first terminals and the third terminals.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
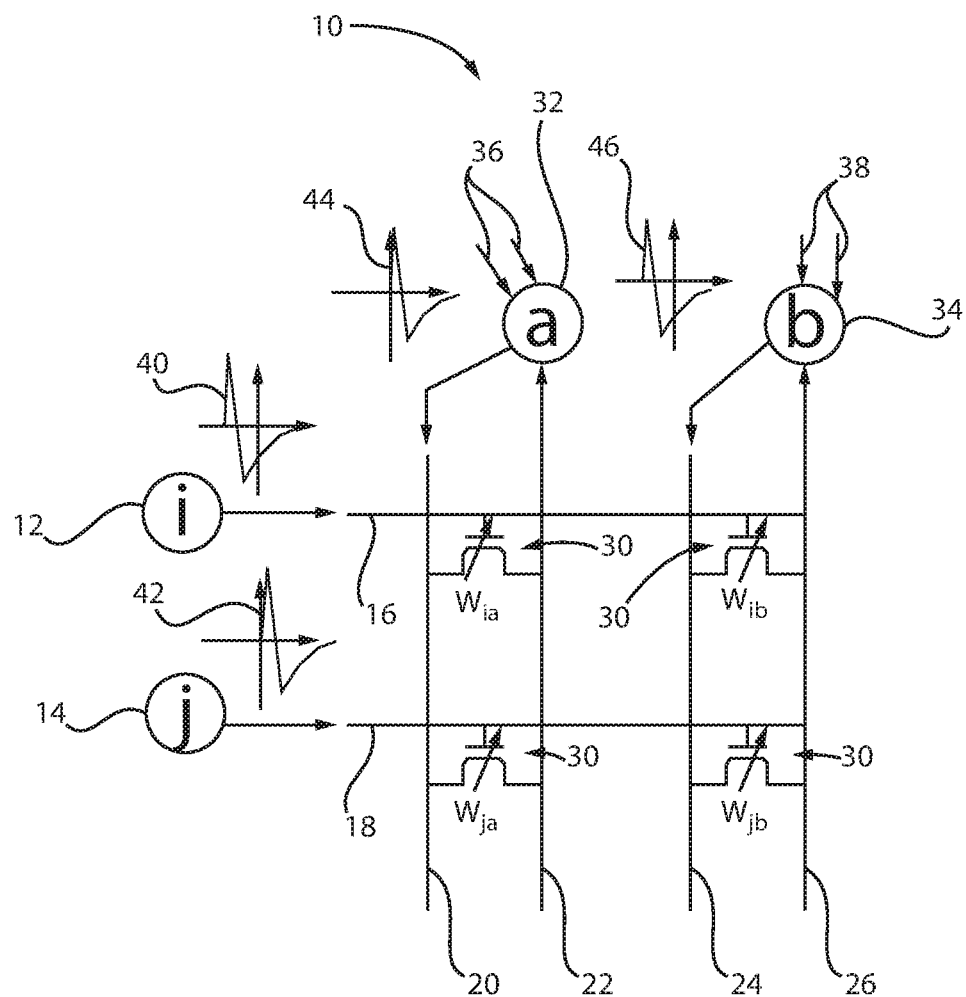
FIG. 1 is a schematic diagram of a layout showing a synaptic network or array with pre-neurons connected to gates of field effect transistors (FETs) in accordance with the present principles.

In accordance with the present principles, neural or synapse networks are provided that include three or four terminal devices as nodes, performing the functions of synapses, neurons, and other complex functions involved in the networks. Artificial neurons, including pre-neurons and post-neurons are fabricated circuits with similar functions as bio neurons, and the artificial neurons are connected by synapse networks in accordance with the present principles to emulate the connections of bio-neurons in a broad manner.

In one embodiment, field effect transistor (FET) devices or FET-based memory devices with three/four terminals are employed. Some FET-based memory, such as floating-gate FETs and HfO$_2$ based ferroelectric FETs (FEFETs) compatible with complementary metal oxide semiconductor (CMOS) processing are employed to provide excellent scalability and programming flexibility for very large scale neural networks.

In useful embodiments, ferroelectric FETs (FEFETs) are employed as three/four-terminal FET-based synaptic devices. The use of FEFET devices, network designs and operational methods based on three/four-terminal-FET cells are employed to realize neural and synaptic arrays and functionality. Compact FET cells are employed to form artificial synaptic networks, including NFETs and/or PFETs to realize various excitatory and inhibitory functions. For example, for PFETs, a polarization (of dipoles) in a vertical direction from the gate to the channel of a FEFET leads to a lower drain current, which represents an inhibition state; for NFETs, the same polarization leads to a higher drain current, which represents an excitation state.

Several synaptic network schemes are provided with source, drain, gate and/or substrate terminals of the FET connected to artificial neurons in flexible ways to achieve feedback loops and other inputs or outputs. $HfO_2$-based ferroelectric FET devices in a synapse array provide excellent power efficiency, performance, scalability and manufacturability (CMOS compatible). The present principles apply to neuromorphic chips with learning ability, as well as the simulation of brain/bio neural circuits, and other applications.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative intended to encompass different orientations of the device in ease or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being between two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a schematic diagram of a device layout is illustratively shown in accordance with the present principles. The layout includes an array 10 of devices 30 connected in a crossbar arrangement of metal lines 16, 18 transversely disposed relative to metal lines 20, 22, 24, and 26. It should be understood that the array 10 is shown having an illustrative array pattern and that the array pattern may be much larger including a large number metal lines and devices. The array 10 includes pre-neuron i 12 and pre-neuron j 14. The pre-neuron i 12 and pre-neuron j 14 are connected to the gates of devices 30. In particular, device $W_{ia}$ has its gate connected to pre-neuron i 12 through line 16, its drain connected to line 20 and its source connected to line 22. Device $W_{ja}$ has its gate connected to pre-neuron i 14 through line 18, its drain connected to line 20 and its source connected to line 22. Device $W_{ib}$ has its gate connected to pre-neuron i 12 through line 16, its drain connected to line 24 and its source connected to line 26. Device $W_{jb}$ has its gate connected to pre-neuron i 14 through line 18, its drain connected to line 24 and its source connected to line 26.

In this way, a pulse or signal 40 is sent from the pre-neuron i 12 on line 16 to the gates of devices $W_{ia}$ and $W_{ib}$. The devices $W_{ia}$ and $W_{ib}$ respond by providing a signal on sources of the devices $W_{ia}$ and $W_{ib}$ respectively to post-neuron a 32 and post-neuron b 34. The post-neurons 32 and 34 include feedback pulses 44, 46 to lines 20 and 24, respectively. Likewise, a pulse or signal 42 is sent from the pre-neuron i 14 on line 18 to the gates of devices $W_{ja}$ and $W_{jb}$. The devices $W_{ja}$ and $W_{jb}$ respond by providing a signal on sources of the devices $W_{ja}$ and $W_{jb}$ respectively to post-neuron a 32 and post-neuron b 34. The post-neurons 32 and 34 include feedback pulses 44, 46 to lines 20 and 24, respectively.

The pre-neurons 12, 14 may include devices 30, input lines, or connections to other circuitry. The post-neurons 32, 34 may include devices 30 and receive inputs 36, 38 from a plurality of other input lines, devices or other circuitry. The devices 30 may include FEFET devices or other FET devices.

A state of the FET devices 30 is indicated based upon the input pulses from pre-neurons 12, 14 and/or post-neurons 32, 34, as well as the various correlations thereof, including a timing delay between the signals from the pre-neurons and the post neurons. A source terminal may receive the same signals as the drain terminal (and/or gate terminal) during the change of the states of the FET devices 30. A time delay between the signals can change the states of the FET devices.

FET devices 30 with memory functions can have multiple, discrete or continuous, digital or analog states based upon the input and feedback signals sent to them, to represent complex connections among neurons in neural networks. The signals applied on the FET devices 30 can be sent from a lower level neural network in previous stages and/or from an upper level neural network in following stages as defined by a signal transmission path in the entire circuit/system. The signals can also be sent from the lower, the same and the upper level of the current stage/level network, but being generated in previous time periods, e.g., in a recurrent neural network. The input and feedback signals sent to FET devices 30 in neural networks in the present embodiments can also be synthesized by the system beyond immediately connected neural networks, for example, from a circuit that oversees multiple levels of neural networks and adapts machine learning algorithms. The signals sent to FET devices 30 in neuron networks herein can also include non-electrical signals, such as, sound, photonic signals (light), magnetic fields, mechanical stress/vibrations, etc. or electrical representations thereof.

Figure 2:
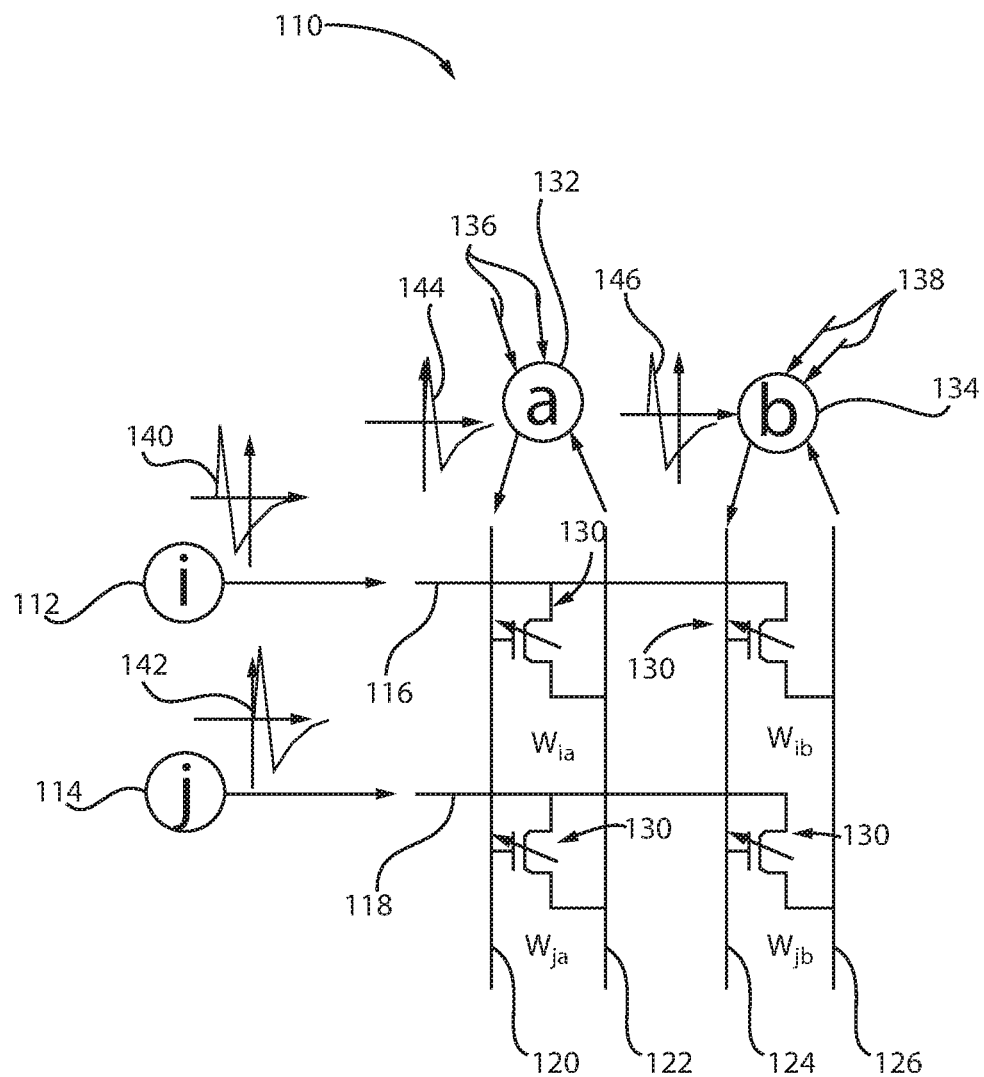
FIG. 2 is a schematic diagram of a layout showing a synaptic network or array with pre-neurons connected to drains of FETs in accordance with the present principles.

Referring to FIG. 2, a schematic diagram of a device layout is illustratively shown in accordance with the present principles. The layout includes an array 110 of devices 130 connected in a crossbar arrangement of metal lines 116, 118 transversely disposed relative to metal lines 120, 122, 124, and 126. It should be understood that the array 110 is shown having an illustrative array pattern and that the array pattern may be much larger including a large number metal lines and devices. The array 110 includes pre-neuron i 112 and pre-neuron j 114. The pre-neuron i 112 and pre-neuron j 114 are connected to the drains of devices 130. In particular, device $W_{ia}$ has its drain connected to pre-neuron i 112 through line 116, its source connected to line 122 and its gate connected to line 120. Device $W_{ja}$ has its drain connected to pre-neuron i 114 through line 118, its source connected to line 122 and its gate connected to line 120. Device $W_{ib}$ has its drain connected to pre-neuron i 112 through line 116, its source connected to line 126 and its gate connected to line 124. Device $W_{jb}$ has its drain connected to pre-neuron i 114 through line 118, its source connected to line 126 and its gate connected to line 124.

In this way, a pulse or signal 140 is sent from the pre-neuron i 112 on line 116 to the drains of devices $W_{ia}$ and $W_{ib}$. The devices $W_{ia}$ and $W_{ib}$ respond by providing a signal on sources of the devices $W_{ia}$ and $W_{ib}$ respectively to post-neuron a 132 and post-neuron b 134. The post-neurons 132 and 134 include feedback pulses 144, 146 to lines 120 and 124, respectively. Likewise, a pulse or signal 142 is sent from the pre-neuron i 114 on line 118 to the drains of devices $W_{ja}$ and $W_{jb}$. The devices $W_{ja}$ and $W_{jb}$ respond by providing a signal on sources of the devices $W_{ja}$ and $W_{jb}$ respectively to post-neuron a 132 and post-neuron b 134. The post-neurons 132 and 134 include feedback pulses 144, 146 to lines 120 and 124, respectively.

The pre-neurons 112, 114 may include devices 130, input lines, or connections to other circuitry. The post-neurons 132, 134 may include devices 130 and receive inputs 136, 138 from a plurality of other input lines, devices or other circuitry. The devices 130 may include FEFET devices or other FET devices.

Figure 3:
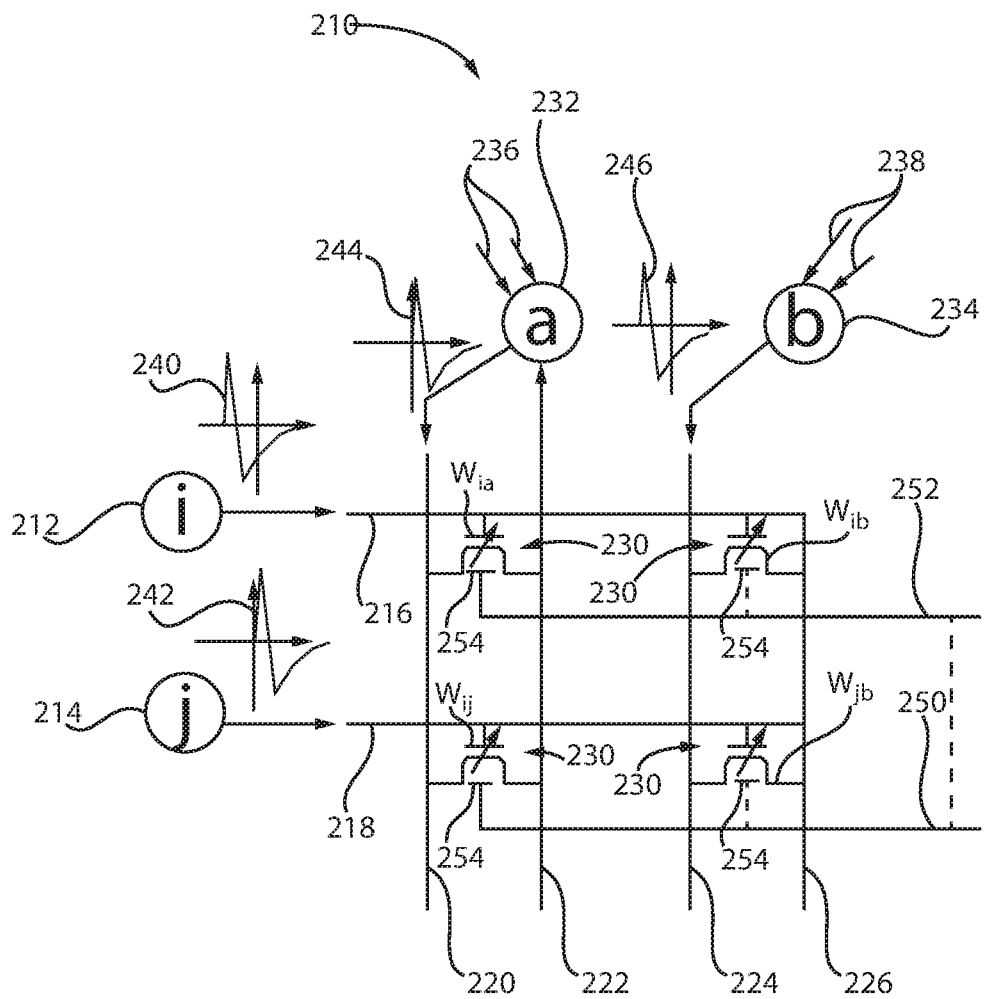
FIG. 3 is a schematic diagram of a layout showing a synaptic network or array with substrate plates for adjusting threshold voltage of FETs in accordance with the present principles.

Referring to FIG. 3, a schematic diagram of a device layout is illustratively shown in accordance with the present principles. The layout includes an array 210 of devices 230 connected in a crossbar arrangement of metal lines 216, 218 transversely disposed relative to metal lines 220, 222, 224, and 226. It should be understood that the array 210 is shown having an illustrative array pattern and that the array pattern may be much larger including a large number metal lines and devices. The array 210 includes pre-neuron i 212 and pre-neuron j 214. The pre-neuron i 212 and pre-neuron j 214 are connected to the gates of devices 230. In particular, device $W_{ia}$ has its gate connected to pre-neuron i 212 through line 216, its drain connected to line 220 and its source connected to line 222. Device $W_{ja}$ has its gate connected to pre-neuron i 214 through line 218, its drain connected to line 220 and its source connected to line 222. Device $W_{ib}$ has its gate connected to pre-neuron i 212 through line 216, its drain connected to line 224 and its source connected to line 226. Device $W_{jb}$ has its gate connected to pre-neuron i 214 through line 218, its drain connected to line 224 and its source connected to line 226.

In this way, a pulse or signal 240 is sent from the pre-neuron i 212 on line 216 to the gates of devices $W_{ia}$ and $W_{ib}$. The devices $W_{ia}$ and $W_{ib}$ respond by providing a signal on drains of the devices $W_{ia}$ and $W_{ib}$ respectively to post-neuron a 232 and post-neuron b 234. The post-neurons 232 and 234 include feedback pulses 244, 246 to lines 220 and 224, respectively. Likewise, a pulse or signal 242 is sent from the pre-neuron i 214 on line 218 to the gates of devices $W_{ja}$ and $W_{jb}$. The devices $W_{ja}$ and $W_{jb}$ respond by providing a signal on drains of the devices $W_{ja}$ and $W_{jb}$ respectively to post-neuron a 232 and post-neuron b 234. The post-neurons 232 and 234 include feedback pulses 244, 246 to lines 220 and 224, respectively.

In addition, substrate terminal bias can increase or decrease channel resistance of each cell through the body effect, independent of the gate. Substrate terminals 254 of different FETs can be shared (e.g., in a bulk process), so that in a synaptic circuit, a large area of the network can be enhanced or suppressed concurrently using a substrate bias. Substrate plates or terminals 254 can also be isolated for each cell (e.g., in semiconductor-on-insulator (SeOI) or SOI) structure) for single synapse modulation. Control lines 250 and 252 may be employed to bias the substrate by providing a substrate voltage ($V_{sub}$) on the substrate terminals 254. In one example, a positive $V_{sub}$ reduces a threshold voltage ($V_{th}$) of the devices 230, which increases synaptic conductance of the device 230 using the body effect. A negative $V_{sub}$ increases a threshold voltage ($V_{th}$) of the devices 230, which decreases synaptic conductance of the device 230 using the body effect.

The pre-neurons 212, 214 may include devices 230, input lines, or connections to other circuitry. The post-neurons 232, 234 may include devices 230 and receive inputs 236, 238 from a plurality of other input lines, devices or other circuitry. The devices 230 may include FEFET devices or other FET devices.

Figure 4:
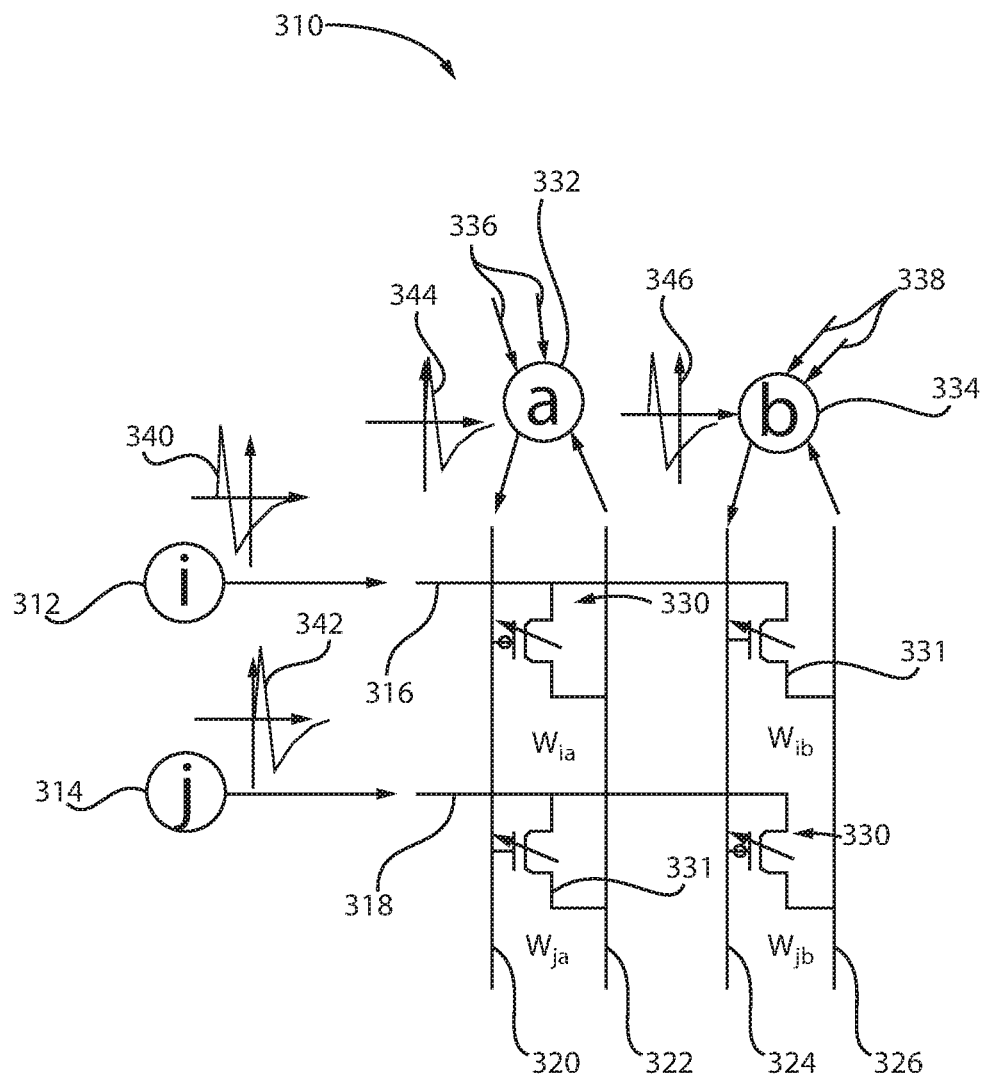
FIG. 4 is a schematic diagram of a layout showing a synaptic network or array with a mixture of PFETs and NFETs in accordance with the present principles.

Referring to FIG. 4, a schematic diagram of a device layout is illustratively shown in accordance with the present principles. The layout includes an array 310 of devices 330, 331 connected in a crossbar arrangement of metal lines 316, 318 transversely disposed relative to metal lines 320, 322, 324, and 326. It should be understood that the array 310 is shown having an illustrative array pattern and that the array pattern may be much larger including a large number metal lines and devices.

The devices 330, 331 include p-type FETs (PFETs) 330 and n-type FETs (NFETs) 331. The PFETs 330 and NFETs 331 may be placed throughout the array 310 in any suitable pattern. FIG. 4 illustratively shows a checkerboard pattern.

The array 310 includes pre-neuron i 312 and pre-neuron j 314. The pre-neuron i 312 and pre-neuron j 314 are connected to the gates of devices 330, 331.

In particular, device $W_{ia}$ includes a PFET 330 and has its drain connected to pre-neuron i 312 through line 316, its source connected to line 322 and its gate connected to line 320. Device $W_{ja}$ includes an NFET 331 and has its drain connected to pre-neuron i 314 through line 318, its source connected to line 322 and its gate connected to line 320. Device $W_{ib}$ includes an NFET 331 and has its drain connected to pre-neuron i 312 through line 316, its source connected to line 326 and its gate connected to line 324. Device $W_{jb}$ includes a PFET 330 and has its drain connected to pre-neuron i 314 through line 318, its source connected to line 326 and its gate connected to line 324.

Synapses of excitation neurons and inhibition neurons can be either NFETs 331 or PFETs 330, in which drain current responds to gate voltage oppositely. In this way, a pulse or signal 340 is sent from the pre-neuron i 312 on line 316 to the drains of devices $W_{ia}$ and $W_{ib}$. The devices $W_{ia}$ and $W_{ib}$ respond by providing a signal on sources of the devices $W_{ia}$ and $W_{ib}$ respectively to post-neuron a 332 and post-neuron b 334. The post-neurons 332 and 334 include feedback pulses 344, 346 to lines 320 and 324, respectively. Likewise, a pulse or signal 342 is sent from the pre-neuron i 314 on line 318 to the drains of devices $W_{ja}$ and $W_{jb}$. The devices $W_{ja}$ and $W_{jb}$ respond by providing a signal on sources of the devices $W_{ja}$ and $W_{jb}$ respectively to post-neuron a 332 and post-neuron b 334. The post-neurons 332 and 334 include feedback pulses 344, 346 to lines 320 and 324, respectively.

The pre-neurons 312, 314 may include devices 330, input lines, or connections to other circuitry. The post-neurons 332, 334 may include devices 330 and receive inputs 336, 338 from a plurality of other input lines, devices or other circuitry. The devices 330, 331 may include FEFET devices or other FET devices.

Figure 5:
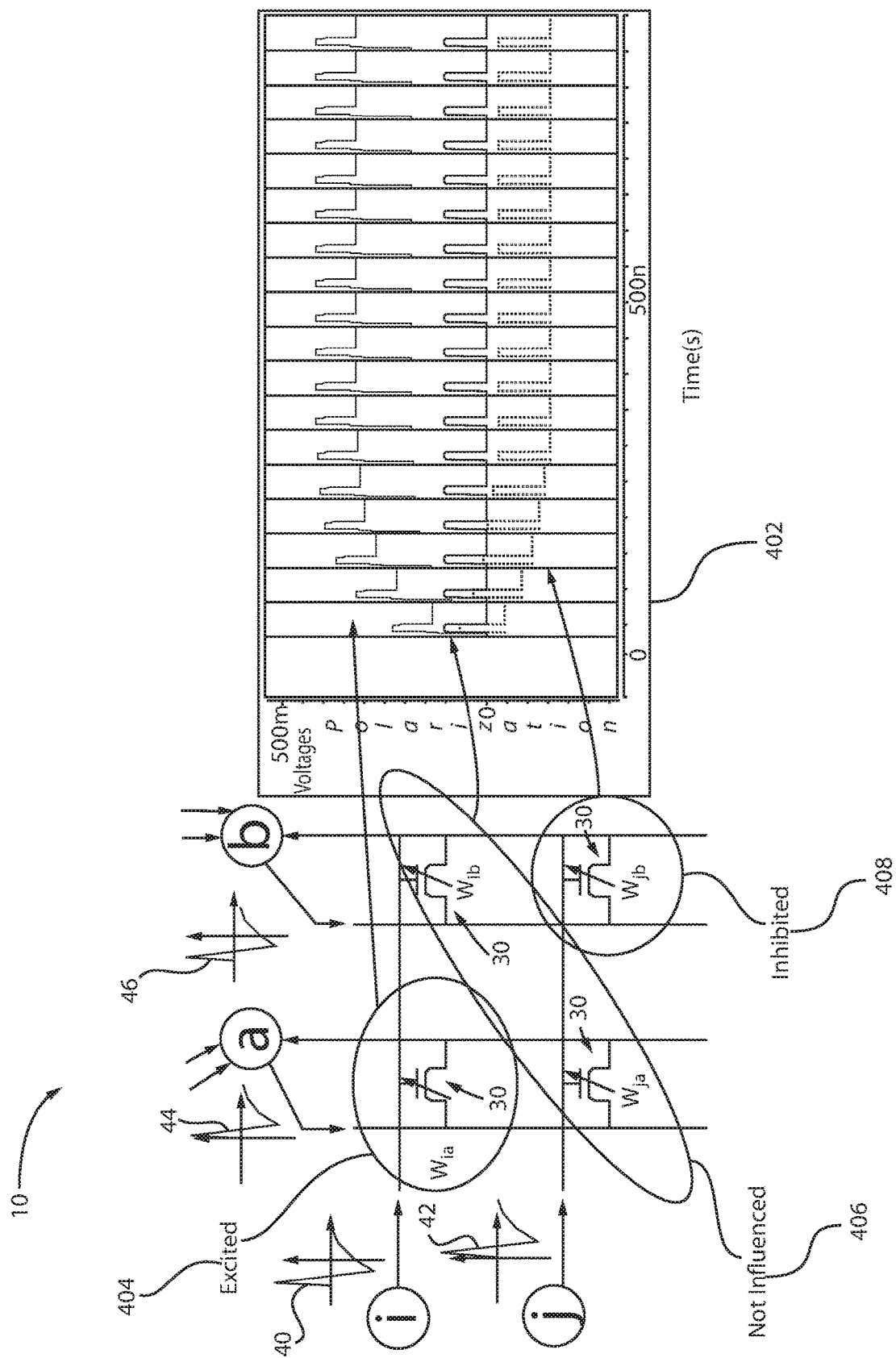
FIG. 5 is a schematic view of a layout and a simulation graph plotting polarization versus time for ferroelectric FETs showing three types of changes in states, e.g., resistance decrease (excitation), resistance increase (inhibition), and resistance unchanged (no influence), for the ferroelectric FETs in accordance with the present principles.

Referring to FIG. 5, a simulation of array 10 is shown in accordance with the present principles. Devices 30 and pulses 40, 42, 44, 46 may be controlled to achieve different effects in the array 10. These effects may include device reactions such as, e.g., excited 404, not influenced 406 and inhibited 408. The excited and inhibited states could have multiple levels, discrete or continuous, and be digital or analog. In one embodiment, the pulses 40, 42, 44, 46 may include spike-timing-dependent plasticity (STDP) pulses. The dipole polarization of FEFET devices changes with these pulses, which are displayed in a simulation panel 402 versus time. In the array 10, pre- and post-neurons spike at different timings (STDP pulses), while the actual gate voltage on each FET 30 is recorded by following reading pulses. Synaptic cells (FETs) are excited, inhibited, or not influenced, based on the spike timing difference between their pre- and post-neurons, respectively, e.g., resistance decrease (excitation), resistance increase (inhibition), and resistance unchanged (no influence) for devices 30. The devices 30 are spiked to provide differentiated outputs. Gate and drain pulses of different timings will change the polarization of a ferroelectric gate stack, and in turn change channel resistance and drain current. These outputs may be employed for pattern recognition or other applications. The differentiated outputs may be influenced by, e.g., channel resistance, charge and polarization states in the gate dielectric of FETs (e.g., ferroelectric polarization and charge storage in floating gates, etc.) as well as device connections (e.g., three or four connections), device types, pulses, etc.

Figure 6:
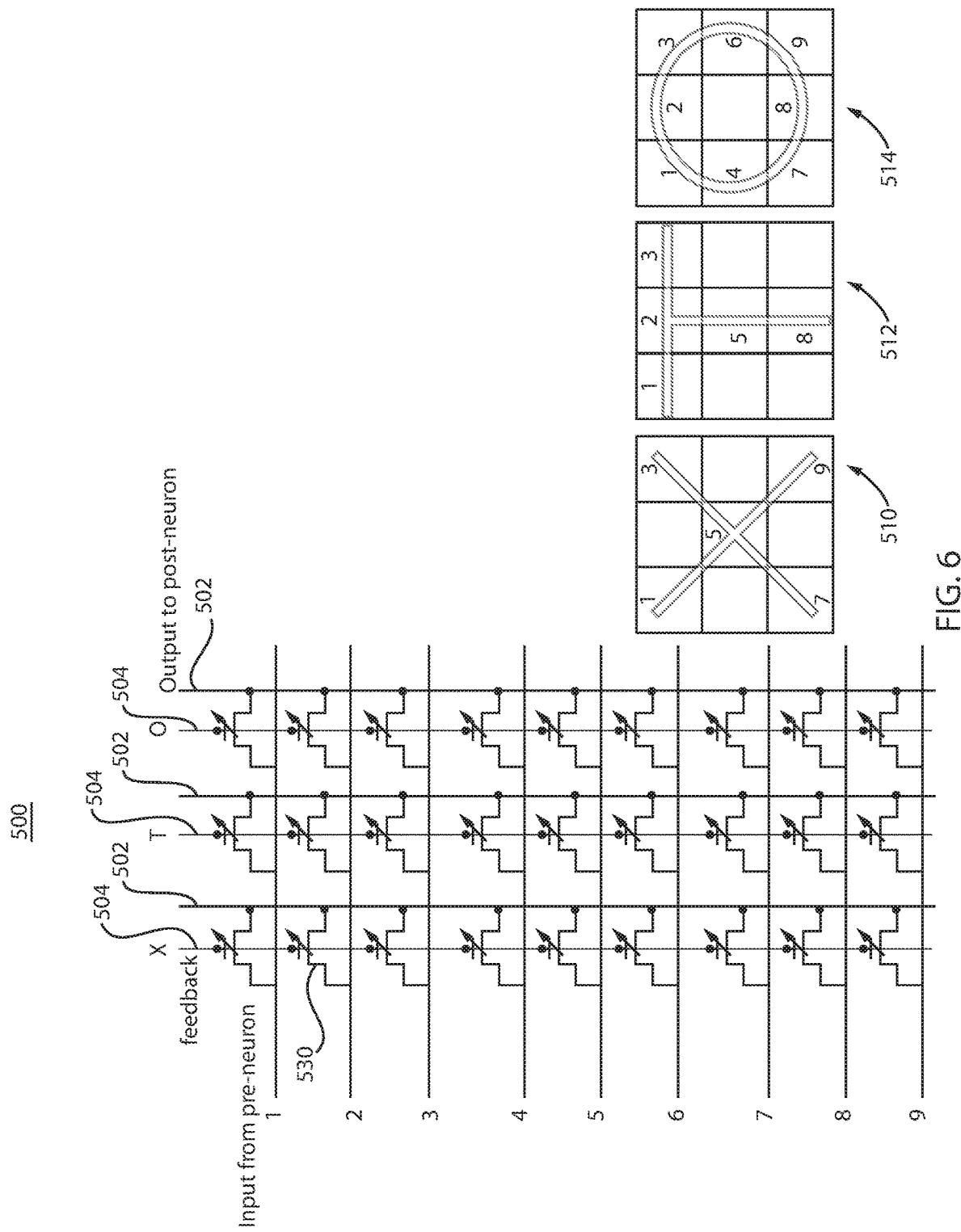
FIG. 6 is a schematic diagram showing a pattern recognition application for displayed characters in accordance with the present principles.

Referring to FIG. 6, an example synapse network 500 is shown in accordance with an illustrative embodiment. The network 500 includes an array of devices 530 (9×3), nine pre-neurons (1-9) and three post-neurons X, T and O. The pre-neurons 1-9 connect to the drains of the devices 530. The post-neurons receive inputs from the devices 530 through the lines 502. Feedback from the post neurons X, T, O connects to the gates of devices 530 from lines 504. In a training session, post-neuron X spikes after pre-neurons 1, 3, 5, 7 and 9 spike; post-neuron T spikes after pre-neurons 1, 2, 3, 5 and 8 spike; and post neuron O spikes after pre-neurons 1, 2, 3, 4, 6, 7, 8 and 9 spike. The spike in X, T or O indicates that the respective pattern (e.g., X in display 510, T in display 512, O in display 514) has been identified/recognized. Network 500 therefore can be employed to monitor 3×3 pixel displays 510, 512, 514 to determine when an X is displayed (510), a T is displayed (512) or an O is displayed (514), as shown. With more training spikes, the total current output to the "X" column becomes higher than that of other columns, indicating excitation of the corresponding FEFET synapses, e.g., spikes of pre-neurons 1,3, 5,7,9 followed by the spike of the post-neuron "X".

Figure 7:
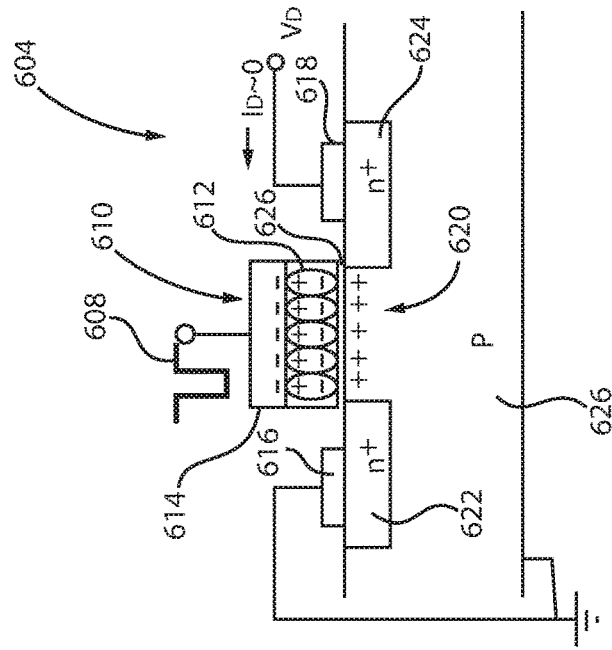
FIG. 7 shows cross-sectional views of a ferroelectric FET (FEFET) in different polarity states due to different input pulses in accordance with the present principles.
Figure 7:
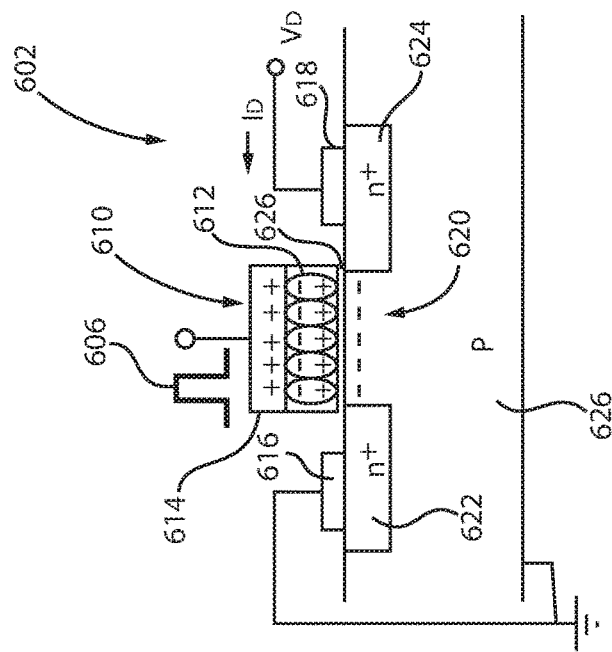

Referring to FIG. 7, devices, 30, 130, 230, 330 and 530 may include FEFETs. FEFETs, include a gate electrode 610, which receives an electric pulse 606 or 608. By applying electric pulses in opposite polarities, the channel resistance in FEFETs changes to a resistance state ranging from a lowest resistance state to a highest resistance state of the FEFET device. Gate and drain pulses of different timings will change the polarization of a ferroelectric gate stack 610, and in turn change channel resistance and drain current ($I_D$).

In a first instance 602, the pulse 606 provides a positive voltage pulse on the gate electrode 610, which causes internal ferroelectric dipoles 612 to align in the vertical direction from the gate to the channel and induce a lower threshold voltage in a NFET channel 620. The channel 620 resistance is affected by the pulse 606, which affects the flow of charge between source regions 622 and drain regions 624. The source regions 622 and drain regions 624 are illustratively shown as n doped in a p-well 626; however, the conductivities may be reversed with complementary doping schemes (i.e., PFET). In this example, the source regions 622 are connected to ground through electrodes 616, and drain regions 624 are connected to $V_D$ by electrode 618, but the source and the drain regions can be connected to other voltage variables for the channel resistance read and update. A gate dielectric 626 may include. HfO$_2$ or other types of insulators with memory effects.

The p-well 626, or n-well in a complementary doping scheme, may be formed in a substrate. The substrate may include a semiconductor-on-insulator (SeOI or SOI), bulk materials (e.g., Si, SiGe, Ge, III-V, etc.) or other semiconducting substrates (e.g., organic semiconductors, carbon nanotube, graphene, and other two-dimensional semiconductor films).

With pulse 606, the polarization of the internal ferroelectric dipoles 612 and the characteristics of the channel 620 are programmed/stored, representing a digital state (e.g., "1" for a single-bit memory device, or "11" for a two-bit memory device, and so on), or an analog state with channel resistance smaller than the resistance state before applying the pulse 606. In a readout scenario, when $V_{gate}$ is set at a selected read voltage, a drain current $I_D$ increases after applying the pulse 606, representing an excited state, and an enhanced connection between the pre-neuron and the post-neuron.

In a second instance 604, the pulse 608 provides a negative voltage pulse on the gate electrode 610, which causes the internal ferroelectric dipoles 612 to align in a vertical direction from the channel to the gate and induce a higher threshold voltage in an NFET channel 620. The channel 620 resistance is affected by the pulse 608, which affects the flow of charge between source regions 622 and drain regions 624. The source regions 622 and drain regions 624 are illustratively shown as n doped in a p-well 626; however, the conductivities may be reversed with complementary doping schemes (i.e., PFET). In this example, the source regions 622 are connected to ground through electrodes 616, and drain regions 624 are connected to $V_D$ by electrode 618, but the source and drain regions can be connected to other voltage variables for the channel resistance read and update.

With pulse 608, the polarization orientation of the internal ferroelectric dipoles 612 and the characteristics of the channel 620 is programmed/stored, representing a digital state (e.g., "0" for single-bit memory device, "00" for a two-bit memory device, as so on), or an analog state with a resistance state larger than the resistance state before applying the polarization 608. In a readout scenario, when $V_{gate}$ is set at a selected gate voltage, a drain current $I_D$ increases after applying the polarization 608, representing a more inhibited state, and a weakened connection between the pre-neuron and the post-neuron.

FEFETs provide many advantages over other memory cells for artificial synapse applications. For example, FEFETs provide fast write speeds (e.g., less than 100 ps), wide and controllable retention ranges (e.g., from milliseconds to years), non-destructive reads and have high endurances, e.g., up to about $10^{16}$ cycles. The resistance states and the retention thereof can be manipulated by varying amplitudes and durations of pulses applied on FEFET terminals. The FEFETs provide three or four terminal devices (e.g., source, gate drain and body), which provide for different configurations and add to the flexibility of device applications and operations. These features are significantly superior to those of Flash and other memory types for artificial synapse applications.

In accordance with the present principles, various FET devices may be employed with or instead of FEFETs. These devices include controllable channel resistance for a synaptic network. While FEFET based cells with a high-k gate dielectric (e.g., HfO$_2$, HfSiO, HfZrO$_2$, etc.) may be employed, other FETs may include Flash FETs (e.g., floating gate, charge trapping gate, nanocrystal gates, etc.), piezoelectric FETs or other FETs with controllable channel resistance. The devices (e.g., devices 30, 130, 230, 330, 530) in accordance with the present principles utilize adjustable retention of memory (e.g., milliseconds to years) to mimic varying duration of synaptic memory, from short- to long-term. Hybrid synaptic devices and networks may be employed that include more than one type of FET and perform corresponding operations, as described herein. Artificial synaptic networks in accordance with the present principles may employ electrical signals, mechanical signals (e.g., the signals sensed by piezoelectric effect), photonic signals, etc.

Figure 8:
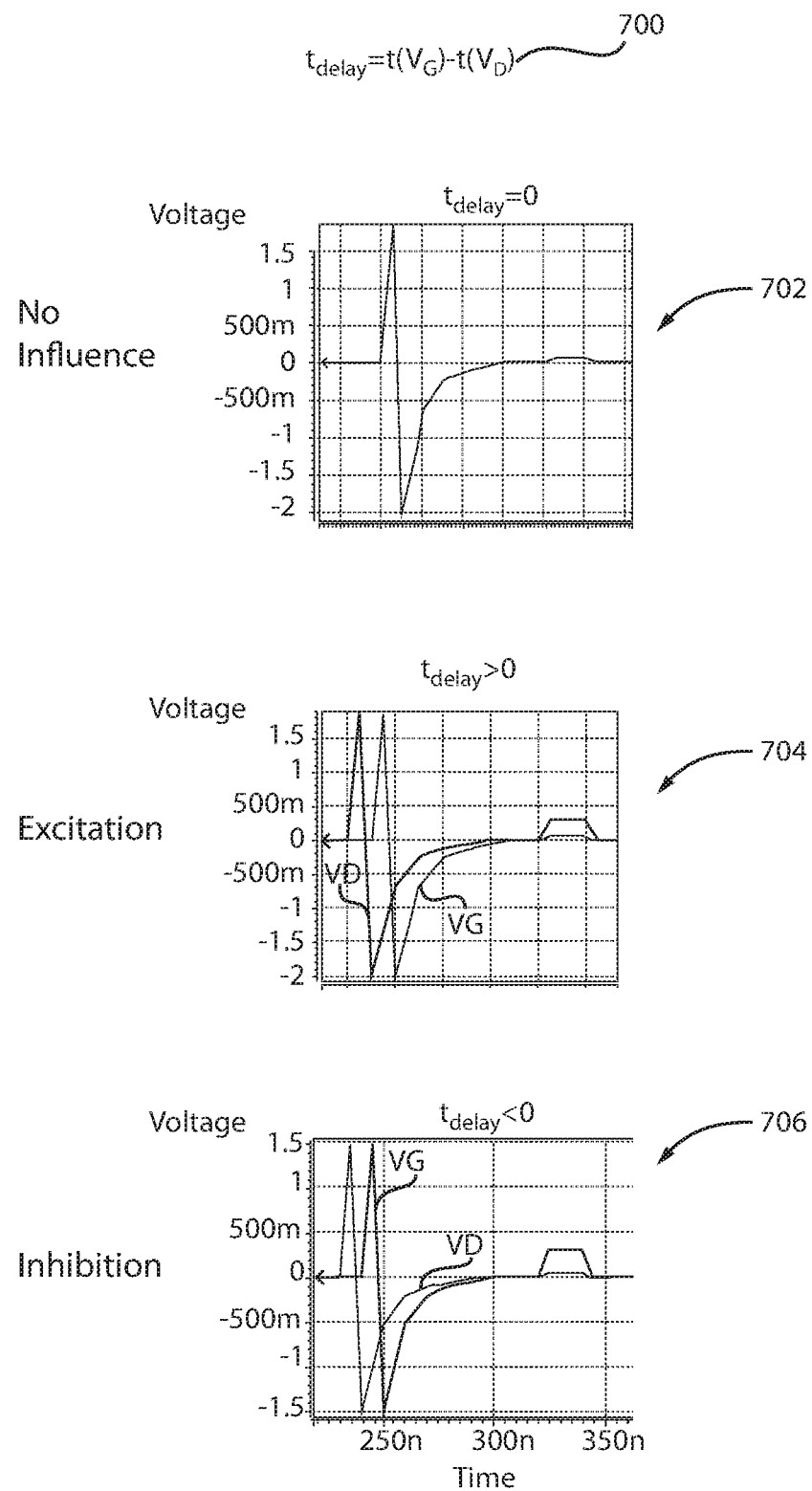
FIG. 8 shows plots for gate voltage and drain voltage with different timing delays for changing a FET state, e.g., no influence, inhibition and excitation, in accordance with the present principles.

Referring to FIG. 8, synaptic cells (FETs) are excited, inhibited or not influenced, based on the spike timing differences between their gates and drains (or pre- and post-neurons). Voltage spikes are applied on the FET devices to provide differentiated outputs. Gate and drain pulses of different timings will change the polarization of the ferroelectric gate stack, and in turn change channel resistance and drain current. Different timings are indicated by $t_{delay}$, which is the difference between the timing of the gate voltage ($V_G$) and the drain voltage ($V_D$) or $t_{delay}=t(V_G)-t(V_D)$ as indicated in formula 700. Plots 702, 704 and 706 illustrate cases of no influence 702 ($t_{delay}=0$), excitation ($t_{delay}>0$) and inhibition ($t_{delay}<0$), which indicate states of the FET devices in the arrays in accordance with the present principles.

Figure 9:
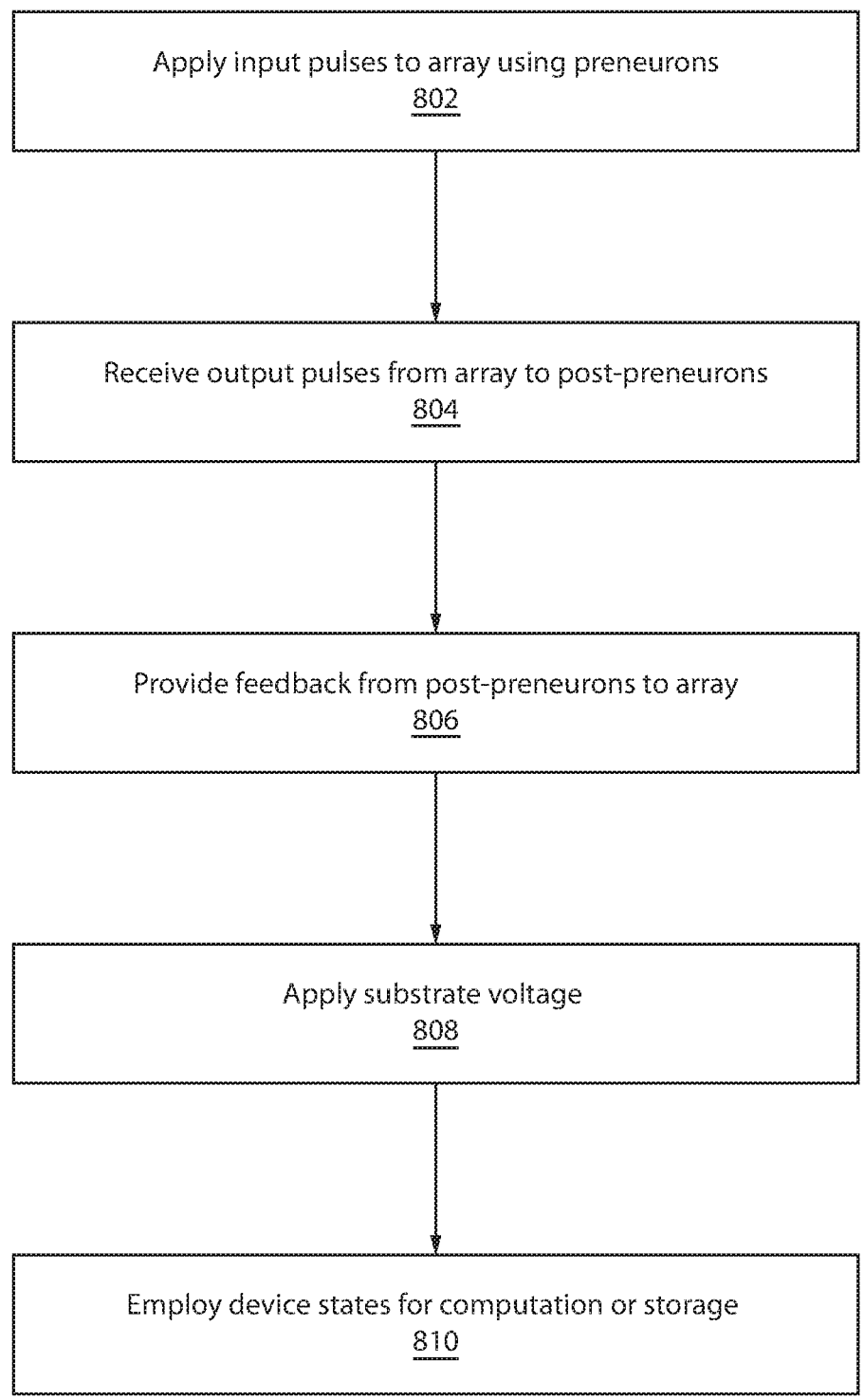
FIG. 9 is a block/flow diagram showing a method for programming or reading a synaptic network device in accordance with the present principles.

Referring to FIG. 9, a method for programming or reading a synapse network device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 802, input pulses are applied from pre-neurons to an array of field effect transistor (FET) devices on first terminals of the FET devices. The input pulses may be set to different timings to change the polarization of the FETs and result in changes in channel resistance and drain current. In block 804, outputs from the array are received on post-neurons coupled to the array from second terminals of the FET devices. The outputs are received from the array on post-neurons coupled to the array from source terminals of the FET devices, wherein a state of the FET devices is read in accordance with the channel resistance of the FET devices.

In block 806, feedback to the array is provided on third terminals of the FET devices (from the post-neurons). Feedback is provided to the array on third terminals of the FET devices, wherein the state of the FET devices is changed based upon signals applied on the first terminals and the third terminals. In block 808, a voltage may be applied to a substrate plate (e.g., a fourth terminal) to adjust controllable channel resistance using a body effect.

The first terminals may include gates of the FET devices, the second terminals may include sources of the FET devices and the third terminals may include drains of the FET devices. In another embodiment, the first terminals may include drains of the FET devices, the second terminals may include sources of the FET devices and the third terminals may include gates of the FET devices.

A state of the FET devices is indicated based upon the channel resistance of the FET devices, which can be changed by the input to the terminals of the FET devices. The FET devices may include ferroelectric FETs and the input pulses may include different polarities and timings to adjust the channel resistance. The timing delay may include a time difference between the pulses on different terminals of FET devices, and the timing delay may result in changes of resistance states, which can be characterized in a broad-brush manner as no influence, inhibitory and excitatory. In block 810, synapse states are employed for computation or storage of information based upon the device states.

Having described preferred embodiments for FET based synapse networks (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims:

What is claimed is:

1. A synapse network device, comprising:
    an array of field effect transistor (FET) devices having controllable channel resistance;
    pre-neurons coupled to the array to provide input pulses to the array on first terminals of the FET devices; and
    post-neurons coupled to the array to receive outputs from the array on second terminals of the FET devices and provide feedback to the array on third terminals of the FET devices, wherein a state of the FET devices is indicated based upon the input pulses and the feedback of the FET devices.

2. The device as recited in claim 1, wherein the FET devices include ferroelectric FETs.

3. The device as recited in claim 1, wherein the feedback includes a timing delay including a timing difference between gate voltage and drain voltage of a FET device of the FET devices.

4. The device as recited in claim 3, wherein the timing delay results in resistance states of the FET devices including no influence, inhibition and excitation.

5. The device as recited in claim 1, wherein the first terminals include gates of the FET devices, the second terminals include sources of the FET devices and the third terminals include drains of the FET devices.

6. The device as recited in claim 1, wherein the first terminals include drains of the FET devices, the second terminals include sources of the FET devices and the third terminals include gates of the FET devices.

7. The device as recited in claim 1, further comprising a substrate terminal to apply a voltage to adjust the controllable channel resistance using a body effect.

8. The device as recited in claim 1, wherein the array of FET devices includes n-type and p-type transistors.

9. A synapse network device, comprising:
    a substrate;
    an array of field effect transistor (FET) devices formed on the substrate and having controllable channel resistance and connected in a crossbar arrangement of metal lines;
    pre-neurons coupled to the array to provide input signals to the array on first terminals of the FET devices, wherein the input pulses are controlled to change channel resistances; and
    post-neurons coupled to the array to receive outputs from the array on second terminals of the FET devices and provide feedback to the array on third terminals of the FET devices, wherein a state of the FET devices is changed based upon the input signals and the feedback applied on the first terminals and the third terminals of the FET devices.

10. The device as recited in claim 9, wherein the FET devices include ferroelectric FETs.

11. The device as recited in claim 9, wherein the feedback includes a timing delay including a time difference between gate voltage and drain voltage of a FET device of the FET devices.

12. The device as recited in claim 9, wherein the state of the FET devices includes one of no influence, inhibition and excitation.

13. The device as recited in claim 9, wherein the first terminals include gates of the FET devices, the second terminals include sources of the FET devices and the third terminals include drains of the FET devices.

14. The device as recited in claim 9, wherein the first terminals include drains of the FET devices, the second terminals include sources of the FET devices and the third terminals include gates of the FET devices.

15. The device as recited in claim 9, further comprising a substrate terminal formed within the substrate to apply a voltage to adjust the controllable channel resistance using a body effect.

16. The device as recited in claim 9, wherein the array of FET devices includes n-type and p-type transistors.

17. A method for programming a synapse network device, comprising:
   applying input pulses from pre-neurons to an array of field effect transistor (FET) devices on first terminals of the FET devices;
   receiving outputs from the array on post-neurons coupled to the array from second terminals of the FET devices, wherein a state of the FET devices is read in accordance with a controllable channel resistance of the FET devices; and
   providing feedback to the array on third terminals of the FET devices, wherein the state of the FET devices is changed based upon signals applied on the first terminals and the third terminals.

18. The method as recited in claim 17, wherein the FET devices include ferroelectric FETs and the input pulses include at least one of different polarities, amplitudes, and durations to adjust the controllable channel resistance.

19. The method as recited in claim 17, wherein the feedback includes a timing delay that includes a time difference between gate voltage and drain voltage of a FET device of the FET devices and the timing delay results in a state including one of no influence, inhibition and excitation.

20. The method as recited in claim 17, further comprising applying a voltage to a substrate terminal to adjust the controllable channel resistance using a body effect.

\* \* \* \* \*